(12) United States Patent
Machida (10) Patent No.: US 7,867,579 B2
(45) Date of Patent: Jan. 11, 2011

(54) METHOD FOR FORMING CARBON PROTECTIVE FILM AND METHOD FOR PRODUCING MAGNETIC RECORDING MEDIUM, MAGNETIC RECORDING MEDIUM AND MAGNETIC RECORDING/REPRODUCING APPARATUS

(75) Inventor: Hiroyuki Machida, Ichihara (JP)

(73) Assignee: Showa Denko K.K., Tokyo (JP)

( * ) Notice: Subject to any disclaimer, the term of this patent is extended or adjusted under 35 U.S.C. 154(b) by 452 days.

(21) Appl. No.: 11/972,347

(22) Filed: Jan. 10, 2008

(65) Prior Publication Data
US 2008/0170327 A1   Jul. 17, 2008

(30) Foreign Application Priority Data
Jan. 12, 2007   (JP) .............................. 2007-004395

(51) Int. Cl.
  *H05H 1/24* (2006.01)
(52) U.S. Cl. ...................... 427/577; 427/130; 427/131
(58) Field of Classification Search ................ 427/577, 427/127, 130, 131
See application file for complete search history.

(56) References Cited

U.S. PATENT DOCUMENTS

| | | | | | |
|---|---|---|---|---|---|
| 5,275,850 | A | * | 1/1994 | Kitoh et al. | 427/577 |
| 5,674,638 | A | * | 10/1997 | Grill et al. | 428/835.2 |
| 6,086,730 | A | * | 7/2000 | Liu et al. | 204/192.16 |
| 2004/0116792 | A1 * | | 6/2004 | Nesbitt | 600/373 |
| 2006/0115584 | A1 * | | 6/2006 | Hattori et al. | 427/127 |
| 2009/0075121 | A1 * | | 3/2009 | Nagata | 428/800 |
| 2010/0007979 | A1 * | | 1/2010 | Tsukada | 360/31 |
| 2010/0206717 | A1 * | | 8/2010 | Kurokawa | 204/192.15 |

FOREIGN PATENT DOCUMENTS

| | | |
|---|---|---|
| JP | 721858 B2 | 3/1995 |
| JP | 773454 A | 3/1995 |
| JP | 11229150 A | 8/1999 |
| JP | 2002025047 A | 1/2002 |
| JP | 2006173343 A | 6/2006 |

OTHER PUBLICATIONS

Iechika, Keigo, et al., "Performance of Hard DLC Protective Film Prepared by PECVD Method for Thin Film Magnetic Disk". IEEE Transactions on Magnetics, vol. 30, No. 6, Nov. 1994, pp. 4134-4136.*

Shohata, Nobuaki, et al., "Mechanical Properties of Diamondlike Carbon Films". Science and Technology of New Diamond, edited by S. Saito et al., pp. 301-304, 1990.*

Fung, M.K., et al., "Deposition of ultra-thin diamond-like carbon protective coating on magnetic disks by electron cyclotron resonance plasma technique". Journal of Non-Crystalline Solids 254 (1999) pp. 167-173.*

Miyake, S., et al., "Durability evaluation of perfluoropolyether-lubricant-coated protective diamond-like carbon film by the lateral vibration friction test". J. Phys. D: Appl. Phys. 38 (2005) pp. 2244-2252.*

* cited by examiner

*Primary Examiner*—Bret Chen
(74) *Attorney, Agent, or Firm*—Sughrue Mion, PLLC (57) ABSTRACT

The present invention provides a method for forming a carbon protective film and a method for producing a magnetic recording medium, that decreases the generation of particles in a plasma CVD apparatus thereby improving flatness of the surface of a carbon protective film, and also can manufacture a magnetic recording medium having high recording density and excellent recording/reproducing characteristics; a magnetic recording medium; and a magnetic recording/reproducing apparatus using the magnetic recording medium.

4 Claims, 4 Drawing Sheets

«METHOD FOR FORMING CARBON PROTECTIVE FILM AND METHOD FOR PRODUCING MAGNETIC RECORDING MEDIUM, MAGNETIC RECORDING MEDIUM AND MAGNETIC RECORDING/REPRODUCING APPARATUS»

BACKGROUND OF THE INVENTION

1. Field of the Invention

The present invention relates to a method for forming a carbon protective film and a method for producing a magnetic recording medium, a magnetic recording medium and a magnetic recording/reproducing apparatus, that are used in hard disk drives and the like.

Priority is claimed on Japanese Patent Application No. 2007-004395, filed in Japan on Jan. 12, 2007, the contents of which are incorporated herein by reference.

2. Background Art

In the field of magnetic recording media, particularly magnetic disks, a remarkable improvement in recording density has recently been made and, in particular, the recording density has increased at a remarkable rate of around 100 times in ten years. There are various technologies that support such improvement in the recording density and one of key technologies includes a technology of controlling sliding characteristics between a magnetic head and a magnetic recording medium.

Generally, since a CSS (contact start-stop) system called Winchester system, in which contact sliding/head floating/contact sliding between a magnetic head and a magnetic recording medium constitutes a basic action, became popularly employed in hard disk drives, sliding of the head on the recording medium became unavoidable and thus a problem relating to tribology between the magnetic head and the magnetic recording medium is a fatal technical problem at present. Therefore, abrasion resistance and sliding resistance of the surface of the medium play an important role in reliability of a magnetic recording medium, and strenuous efforts on the development and improvement of a protective film, lubricating film, and the like to be laminated on a magnetic film have been exerted.

As the protective film of the magnetic recording medium, those made of various materials are proposed. From an overall viewpoint of film forming properties, durability, and the like, a carbon film is mainly employed. The carbon film is usually formed by a sputtering method and the conditions upon film formation are vividly reflected in corrosion resistance of the carbon film or CSS characteristics and are therefore very important.

It is preferred to decrease the flying height of the magnetic head and to increase the rotation speed of the medium so as to improve the recording density, and thus it has become required to impart higher sliding durability to the magnetic recording medium.

It has become required to decrease the thickness of the protective film as thin as possible, for example, a thickness of 100 Å or less, so as to increase the recording density by decreasing spacing loss. A thin and tough protective film, not to mention smoothness, are strongly desired.

However, in a carbon protective film formed by a conventional sputtering film formation method, when the thickness of the film is decreased as thin as possible, for example, 100 Å or less, the durability thereof sometimes becomes insufficient.

Therefore, as a method capable of forming a carbon protective film having a high strength as compared with the case of using a sputtering method, a method employing a plasma CVD method (for example, Japanese Examined Patent Application, Second Publication No. Hei 7-21858; Japanese Unexamined Patent Application, First Publication No. Hei 7-73454) is widely used.

However, in the methods as described in said Japanese Patent Applications (Publication Nos. Hei 7-21858 and Hei 7-73454) in which the carbon protective film is formed using the plasma CVD method, carbon is accumulated not only on the surface of a substrate, but also on the exposed surface in a film formation chamber, for example, the surfaces of electrodes and the like in a film formation device. When the accumulation amount of carbon on the exposed surface in the film formation chamber increases, the film made of accumulated carbon is peeled from the exposed surface due to internal stress. When particles of carbon produced by peeling adhere on the surface of the substrate, there arises a problem that protrusions are formed on the surface of the carbon protective film to cause local film thickness abnormality, thus resulting in product failure. Particularly, when the carbon protective film is formed using the plasma CVD method, the resulting film made of carbon has high hardness and also has high internal stress as compared with the case of forming the carbon protective film using a conventional sputtering method. Therefore, a lot of carbon particles are generated to cause a problem such as film thickness abnormality described above.

A method of removing a carbon film accumulated in a film formation device through ashing using oxygen plasma (for example, Japanese Unexamined Patent Application, First Publication No. Hei 11-229150; Japanese Unexamined Patent Application, First Publication No. 2002-025047) has been proposed so as to prevent such above-mentioned generation of particles.

Also, a method of suppressing peeling of an accumulation on electrodes by roughening the surfaces of the electrodes (for example, Japanese Unexamined Patent Application, First Publication No. 2006-173343) so as to prevent the generation of particles in a treatment chamber in a plasma CVD apparatus has been proposed.

Further improvement in the smoothness of the surface of a magnetic recording medium so as to further improve the recording density of the magnetic recording medium has recently been desired. However, even in the case of using the methods described in said Japanese Patent Applications (Publication Nos. Hei 11-229150, 2002-025047 and 2006-173343), there is a problem that the generation of particles cannot be sufficiently decreased and it is difficult to enhance flatness of the surface of the magnetic recording medium. Therefore, a method capable of decreasing the generation of particles in the plasma CVD apparatus is desired more than ever.

SUMMARY OF THE INVENTION

The present invention has been made so as to solve the above problems and an object thereof is to provide a method for forming a carbon protective film and a method for producing a magnetic recording medium, that can effectively decrease the generation of particles in a plasma CVD apparatus thereby improving flatness the surface of a carbon protective film, and also can manufacture a magnetic recording medium having high recording density and excellent recording/reproducing characteristics; a magnetic recording medium; and a magnetic recording/reproducing apparatus using the magnetic recording medium.

The present inventors have intensively studied so as to achieve the above object and found that it is possible to suppress an electrode material from mixing into a carbon protective film on a substrate as a result of peeling of a carbon film deposited on electrodes by preliminarily subjecting the surfaces of the electrodes arranged in a film formation chamber to a roughening treatment in the case of forming a carbon protective film on a substrate by a plasma CVD method and repeating the formation of the carbon protective film on the surface of the substrate and the removal of the carbon film accumulated on the surfaces of the electrodes through ashing in the film formation chamber.

The present inventors found out that when a carbon film deposited on the surfaces of the electrodes is completely removed by ashing, there is a possibility that the surfaces of the electrodes is sputtered by ions formed in the film formation chamber and the electrode material is mixed into the carbon protective film of the magnetic recording medium. Consequently, the present inventors have found it possible to effectively suppress an electrode material from mixing into a carbon protective film as a result of sputtering of the surfaces of electrodes by providing a step of forming a carbon film on the surfaces of the electrodes in a state where a substrate is not arranged in a film formation chamber after removing the carbon film through ashing. Thus, the present invention has been completed.

Namely, the present invention pertains to the following.

[1] A method for forming a carbon protective film in which a disk-shaped substrate with a magnetic film formed thereon is arranged and electrodes are arranged spaced opposed relation to each other on both surfaces of the substrate in a film formation chamber, and then plasma is generated between the electrodes and the substrate in a carbon-containing gas thereby forming a carbon protective film on both surfaces of the substrate through a chemical vapor deposition (CVD) method, the method comprising using, as the electrodes, electrodes whose surfaces have been subjected to a roughening treatment, a film formation step of forming a carbon protective film on the substrate in a state where the substrate is arranged in the film formation chamber, and a removing step of removing a carbon film accumulated on the surfaces of the electrodes through ashing in a state where the substrate is not arranged in the film formation chamber, and repeating the film formation step and the removing step in this sequence.

[2] The method for forming a carbon protective film according to [1], wherein the film formation step and the removing step are repeated in this sequence, and the removing step is performed after repeating the film formation step multiple times.

[3] The method for forming a carbon protective film according to [1] or [2], wherein the film formation step and the removing step are repeated in this sequence, and a coating step of forming a carbon film on the surfaces of the electrodes in a state where the substrate is not arranged in the film formation chamber is further provided between the removing step and the subsequent film formation step.

[4] A CVD apparatus for formation of a carbon protective film, comprising electrodes having roughened surfaces arranged in a film formation chamber.

[5] The CVD apparatus for formation of a carbon protective film according to [4], wherein the electrodes are made of a stainless steel and the surface roughness Ra is within a range from 8 to 9 μm.

[6] A method for producing a magnetic recording medium in which at least a magnetic film and a carbon protective film are formed on a non-magnetic substrate, the method comprising forming the carbon protective film using the method for forming a carbon protective film according to any one of [1] to [3], or the CVD apparatus for formation of a carbon protective film according to [4] or [5].

[7] A magnetic recording medium, that is produced by the method for producing a magnetic recording medium according to [6].

[8] A magnetic recording/reproducing apparatus comprising the magnetic recording medium according to [7], a driving section operable to drive the magnetic recording medium in a recording direction, a magnetic head comprising a recording section and a reproducing section; head driving means operable to cause relative movement of the magnetic head toward the magnetic recording medium, and recording/reproducing signal processing means operable to cause input of signals into the magnetic head and reproduction of output signals from the magnetic head.

According to the method for forming a carbon protective film and the method for producing a magnetic recording medium of the present invention, it is possible to prevent a carbon film deposited on the surfaces of electrodes from being released into a film formation chamber in the form of particles generated after peeling because the method comprises using, as the electrodes, electrodes whose surfaces have been subjected to a roughening treatment, a film formation step of forming a carbon protective film on the substrate in a state where the substrate is arranged in the film formation chamber, and a removing step of removing a carbon film accumulated on the surfaces of the electrodes through ashing in a state where the substrate is not arranged in the film formation chamber, and repeating the film formation step and the removing step in this sequence in the case of forming the carbon protective film on both surfaces of the substrate by a chemical vapor deposition (CVD) method.

Also, according to the method in which the removing step is performed after repeating the film formation step multiple times, it is possible to suppress particles of an electrode material from generating after sputtering of the surfaces of electrodes.

Furthermore, according to the method in which a coating step of forming a carbon film on the surfaces of the electrodes is provided between the removing step and the subsequent film formation step, it is possible to prevent the surfaces of the electrodes from sputtering and to suppress the carbon film accumulated on the surfaces of the electrodes from peeling, thus making it possible to more effectively suppress the generation of particles in the film formation chamber.

Consequently, a carbon protective film having excellent flatness can be formed on a substrate, thus making it possible to provide a magnetic recording medium having high recording density and excellent recording/reproducing characteristics, and a magnetic recording/reproducing apparatus.

BRIEF DESCRIPTION OF THE REFERENCE NUMERALS

1: Film formation device
2: Magnetic recording medium
3: Sputtering film formation device
4: Magnetic recording/reproducing apparatus
10: Film formation chamber
11: Electrodes
11a: Surface of electrodes
21: Non-magnetic substrate
22: Non-magnetic undercoat film
23: Magnetic film
24: Carbon protective film
25: Lubricant layer
41: Driving section
42: Magnetic head
43: Head driving section (Head driving means)
44: Recording/reproducing signal processing system (Recording/Reproducing Signal Processing Means)
D: Substrate
D1, D2: Surface of substrate

DETAILED DESCRIPTION OF THE INVENTION

Embodiments of a method for forming a carbon protective film and a method for producing a magnetic recording medium, a magnetic recording medium and a magnetic recording/reproducing apparatus of the present invention will now be described with reference to FIGS. 1 to 3.

The method for forming a carbon protective film of the present embodiment is a method for forming a carbon protective film in which a disk-shaped substrate D with a magnetic film formed thereon is arranged and electrodes 11 are arranged spaced opposed to each other on both surfaces of the substrate D in a film formation chamber in a film formation device (a CVD apparatus for formation of a carbon protective film) 1, and then plasma is generated between the electrodes 11 and the substrate D in a carbon-containing gas thereby forming a carbon protective film (see the reference numeral 24 in FIG. 2) on both surfaces of the substrate D through a chemical vapor deposition (CVD) method, the method comprising using, as the electrodes, electrodes 11 whose surfaces have been subjected to a roughening treatment, a film formation step of forming a carbon protective film 24 on the substrate D in a state where the substrate D is arranged in the film formation chamber 10, and a removing step of removing a carbon film accumulated on the surfaces 11a of the electrodes 11 through ashing in a state where the substrate is not arranged in the film formation chamber 10, and repeating the film formation step and the removing step in this sequence.

Magnetic Recording Medium

An example of a magnetic recording medium obtained by a method for forming a carbon protective film and a method for producing a magnetic recording medium of the present embodiment will now be described with reference to a schematic cross-sectional view of FIG. 2.

Figure 2:
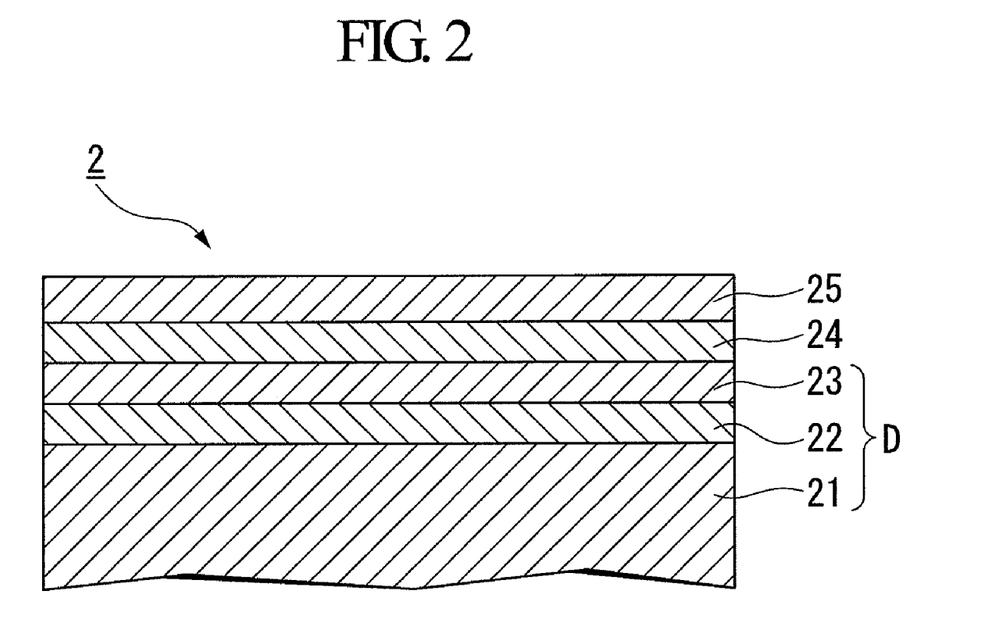
FIG. 2 is a view that schematically illustrates an example of a magnetic recording medium of the present invention, in which the structures of each layer to be formed on a non-magnetic substrate is shown.

The magnetic recording medium 2 of the present embodiment shown in FIG. 2 mainly comprises a non-magnetic undercoat film 22 and a magnetic film 23 laminated sequentially on a non-magnetic substrate 21, and a carbon protective film 24, which is formed by a formation method of the present embodiment, laminated on the magnetic film 23. In the magnetic recording medium 2 shown in FIG. 2, a lubricant layer 25 is provided on the carbon protective film 24.

As the material of the non-magnetic substrate 21, a non-magnetic material used as a substrate of a magnetic recording medium can be commonly used without any limitation. For example, it is possible to use substrates made of various glasses, silicon, and the like, in addition to an aluminum alloy substrate with a NiP-plated film formed thereon. Also, the non-magnetic substrate 21 of the present embodiment may be composed of a base substance made of a glass material, and a surface layer formed on the surface of the base substance by vapor deposition of a film made of at least one kind selected from NiP, a NiP alloy and other alloys using a method such as a plating or sputtering method.

The surface of the non-magnetic substrate 21 is preferably subjected to a texturing treatment such as a mechanical texturing treatment, and it is more preferred to use a non-magnetic substrate having a surface average roughness Ra controlled within a range from 1 to 20 Å.

The non-magnetic substrate 21 can be subjected to a pre-treatment using a gas (a treating gas) activated by plasma generated under a pressure close to atmospheric pressure.

As the material of the non-magnetic undercoat film 22, a Cr alloy of one or more kinds selected from the group consisting of Ti, Mo, Al, Ta, W, Ni, B, Si, Mn and V, and Cr, or Cr can be used. It is particularly preferred to use Cr, a Cr—Ti-based alloy, a Cr—W-based alloy, a Cr—V-based alloy, or a Cr—Si-based alloy.

When the non-magnetic undercoat film 22 is an undercoat film having a multi-layered structure, at least one layer among the layers constituting the non-magnetic undercoat film 22 can be composed of the Cr alloy or Cr.

Also, the non-magnetic undercoat film 22 can be composed of a Ni—Al-based alloy, a Ru—Al-based alloy, or a Cr alloy (an alloy of one or more kinds selected from the group consisting of Ti, Mo, Al, Ta, W, Ni, B, Si and V, and Cr).

Also, when the non-magnetic undercoat film 22 is provided with a multi-layered structure, at least one layer among the layers constituting the non-magnetic undercoat film 22 can be composed of a Ni—Al-based alloy, a Ru—Al-based alloy, or the Cr alloy.

Also, the thickness of the non-magnetic undercoat film 22 is preferably adjusted within a range from 50 to 1,000 Å.

It is preferred to use, as the material of the magnetic film 23, a Co alloy that is composed mainly of Co and also has an hcp structure. For example, the material preferably includes at least one kind selected from a Co—Cr-based alloy, a Co—Cr—Ta-based alloy, a Co—Cr—Pt-based alloy, a Co—Cr—Pt—Ta-based alloy, a Co—Cr—Pt—B-based alloy, and a Co—Cr—Pt—B—Cu-based alloy.

In the magnetic recording medium of the present embodiment, the magnetic film may have two or more kinds of laminated structures.

The thickness of the magnetic film 23 is preferably adjusted within a range from 50 to 800 Å.

It is preferred to provide an intermediate layer made of a non-magnetic material, that is a Co alloy composed mainly of Co and also has an hcp structure, between the non-magnetic undercoat film 22 and the magnetic film 23 because the intermediate layer promotes epitaxial growth of the Co alloy. When the intermediate layer is provided, a material including any one kind selected from a Co—Cr-based alloy, a Co—Cr—Ru-based alloy, a Co—Cr—Ta-based alloy, and a Co—Cr—Zr-based alloy can be used.

The carbon protective film 24 constituting the magnetic recording medium 2 of the present embodiment is a protective film laminated by the method for forming a carbon protective film of the present embodiment, details of which are described hereinafter.

Examples of the material used as the carbon protective film include various carbon-based materials such as an amorphous carbon, a hydrogen-containing carbon, a nitrogen-containing carbon and a fluorine-containing carbon, in addition to a CVD carbon formed by a plasma CVD method such as a formation method of the present embodiment. Of these materials, a CVD carbon is preferably used because it has a hard and dense structure and is excellent in durability, economical efficiency and productivity.

When the thickness of the carbon protective film 24 is too small, durability deteriorates. In contrast, when the thickness is too large, loss during recording/reproducing drastically increases. Therefore, the thickness is preferably adjusted within a range from 10 to 150 Å (1 to 15 nm), and more preferably from 20 to 60 Å (2 to 6 nm).

In the magnetic recording medium 2 of the present embodiment, the lubricant layer 25 as an outermost layer is a layer made of a material containing Fombrin type lubricant, or a polymer of a polymerizable unsaturated group-containing perfluoropolyether compound. Herein, the polymerizable unsaturated group-containing perfluoropolyether compound includes a compound in which an organic group having a polymerizable unsaturated bond is bonded to at least one end of a perfluoropolyether as a main chain.

The magnetic recording medium manufactured by the method for forming a carbon protective film and the method for producing a magnetic recording medium of the present invention may be either an in-plane magnetic recording medium or a perpendicular magnetic recording medium.

The non-magnetic material used as the substrate of the magnetic recording medium may be any non-magnetic material, for example, an Al alloy such as an Al—Mg alloy containing Al as a main component, silicon, titanium, ceramics and various resin materials, in addition to the non-magnetic material described above.

Method for Forming Carbon Protective Film and Method for Producing Magnetic Recording Medium An example of the method for forming a carbon protective film and the method for producing a magnetic recording medium of the present embodiment will now be described with reference to a film formation device (CVD apparatus for formation of a carbon protective film) 1 as an example shown in FIG. 1 and a magnetic recording medium 2 as an example shown in FIG. 2.

As described above, the method for forming a carbon protective film of the present embodiment is a method for forming a carbon protective film in which a disk-shaped substrate D (see the reference numeral D in the magnetic recording medium 2 shown in FIG. 2) with at least a magnetic film 23 formed thereon is arranged and electrodes 11 are arranged spaced opposed to each other on both surfaces D1, D2 of the substrate D in a film formation chamber 1, and then plasma is generated between the electrodes 11 and the substrate D in a carbon-containing gas thereby forming a carbon protective film 5 on both surfaces of the substrate D through a chemical vapor deposition (CVD) method, the method comprising using, as the electrodes, electrodes 11 whose surfaces have been subjected to a roughening treatment, a film formation step of forming a carbon protective film 24 on the substrate D in a state where the substrate D is arranged in the film formation chamber 10, and a removing step of removing a carbon film accumulated on the surfaces of the electrodes 11 through ashing in a state where the substrate is not arranged in the film formation chamber 10, and repeating the film formation step and the removing step in this sequence.

Film Formation Device: CVD apparatus for Formation of Carbon Protective Film

Figure 1:
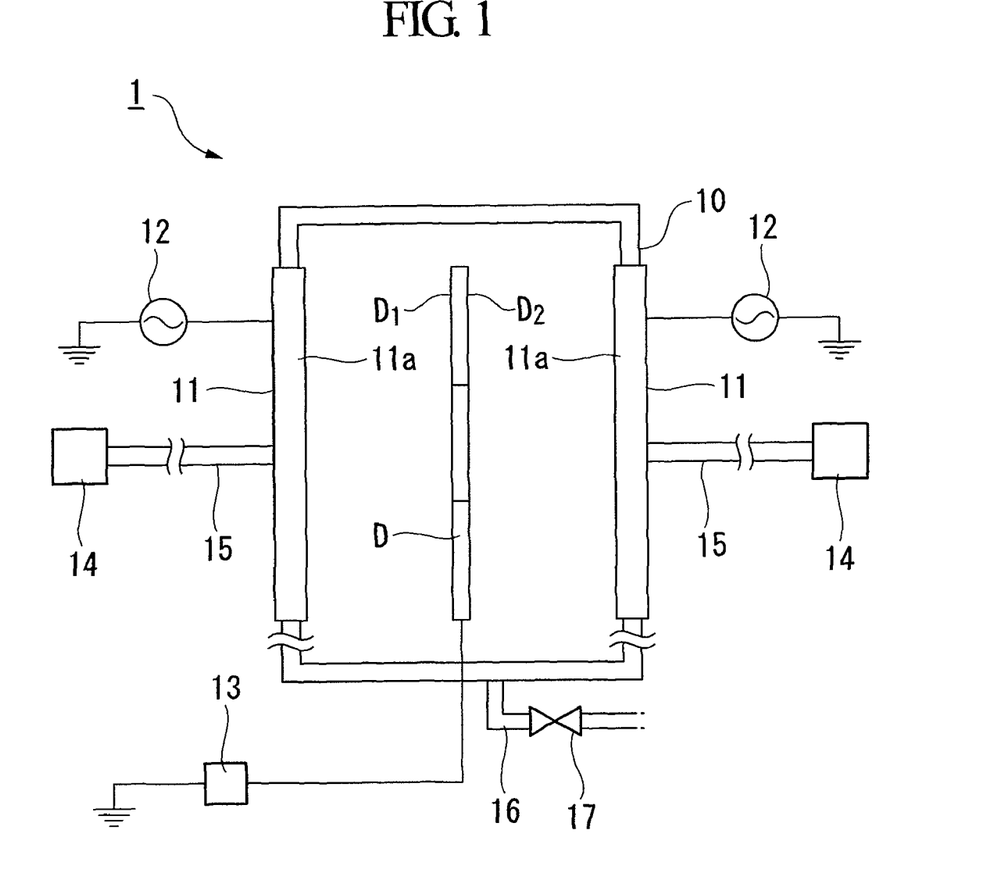
FIG. 1 is a view that schematically illustrates an example of a method for forming a carbon protective film of the present invention, in which a film formation device for formation of a carbon protective film on the surface of substrate is shown.

The film formation device (a CVD apparatus for formation of a carbon protective film) 1 shown in FIG. 1 is an example of a plasma CVD apparatus constituting a main section of a manufacturing apparatus used to carry out the method for forming a carbon protective film of the present invention. This film formation device 1 is a device for formation of a carbon protective film 24 and mainly comprises a film formation chamber 10 that encases a substrate D; electrodes 11 that are arranged opposed to each other on the inner surface of both side walls of the film formation chamber 10, the surfaces of the electrodes having been subjected to a roughening treatment; a power source 12 for applying electric power to these electrodes 11; and a supply source 14 of a reacting gas as a material of the carbon protective film 24 to be formed on the substrate D. In the present embodiment, the film formation device 1 preferably comprises a bias power source 13 for applying a bias voltage to the substrate D arranged in the film formation chamber 10, if necessary.

To the film formation chamber 10, an introducing tube 15 for introducing the reacting gas supplied from the supply source 14 into the film formation chamber 10 and a discharging tube 16 for discharging a gas in the film formation chamber 10 out of the system are connected. The discharging tube 16 is provided with a discharge amount control valve 17, and the internal pressure of chamber 10 can be set to an arbitrary value by adjusting the discharge amount.

As the method for a roughening treatment of the surfaces of electrodes 11, a sandblasting treatment is preferably used. As particles for the sandblasting treatment, SiC, $Al_2O_3$, $SiO_2$ and/or the like can be used. With respect to the surface roughness of the electrodes 11 after subjecting to the sandblasting treatment, when a stainless steel is used as the material of the electrodes 11, the surface roughness Ra is preferably adjusted within a range from 8 to 9 μm.

Electric power for generating plasma between the electrodes 11 and the substrate D in a carbon-containing gas is supplied from the power source 12 in the method for forming a carbon protective film of the present embodiment.

As the power source 12, for example, a high frequency power source, a microwave power source or a DC power source can be used.

It is preferred to use a power source 12 having a capacity capable of applying electric power of 50 to 2,000 W to the electrodes 11 upon formation of the carbon protective film 24.

In the method for forming a carbon protective film of the present embodiment, as shown in FIG. 1, a bias voltage is preferably applied to the substrate D using the bias power source 13.

As the bias power source 13, a DC power source or a pulse current power source is preferably used. The bias voltage to be applied to the substrate D is preferably a DC and pulse voltage (average voltage) within a range from −400 to −10 V.

Method for Forming Carbon Protective Film

In the method for forming a carbon protective film of the present embodiment, as described above, the film formation step and the removing step are repeated in this sequence. By repeating the film formation step of forming the carbon protective film 24 on the substrate D in a state where the substrate D is arranged in the film formation chamber 10, and the removing step of removing a carbon film accumulated on the surfaces of the electrodes 11 through ashing in a state where the substrate D is not arranged in the film formation chamber 10, it becomes possible to remove the carbon film accumulated on the surfaces of the electrodes 11 upon formation of the carbon protective film 24 on the surface of the substrate D. However, by only repeating the film formation step and the removing step through ashing, there is a possibility that the carbon film gradually accumulates on the electrodes 11 and a residue is generated as particles after removing through ashing. Therefore, in the present embodiment, a method of suppressing peeling of an accumulation and the like using, as the electrodes, electrodes 11 whose surfaces 11a have been subjected to a roughening treatment is employed.

Ashing described in the present invention means that the carbon film accumulated on the electrodes 11 is removed by gasification using plasma. Examples of plasma generated herein include oxygen plasma, hydrogen plasma and halogen gas plasma. It is considered that the carbon film is decomposed into CO gas and $CO_2$ gas by oxygen plasma, the carbon film is decomposed into, for example, $CH_4$ gas by hydrogen plasma, and the carbon film is decomposed into a halide gas of carbon by halogen gas plasma. It is particularly preferred to use an oxygen gas plasma in view of the removing rate.

In the method for forming a carbon protective film of the present invention, it is more preferred that the film formation step and the removing step described above are repeated in this sequence and the film formation step is continuously repeated multiple times and then the removing step is performed. According to a manufacturing process with such a constitution, since the carbon film accumulated on the surfaces 11a of the electrodes 11 is not completely removed and the film formation step is performed in a state of being slightly coated, like a thin film, it becomes possible to prevent an electrode material from being released into the film formation chamber 10 after sputtering.

In the method for forming a carbon protective film of the present invention, it is more preferred that the film formation step and the removing step are repeated in this sequence, and a coating step of forming a carbon film on the surfaces 11a of the electrodes 11 in a state where the substrate D is not arranged in the film formation chamber 10 is provided between the removing step and the subsequent film formation step.

As described above, by repeating the formation of the carbon protective film 24 on the surface of the substrate D and the removal of the carbon film accumulated on the surfaces 11a of the electrodes 11 through ashing, it becomes possible to remove the carbon film accumulated on the surfaces 11a of the electrodes 11 upon formation of the carbon protective film 24 on the surface of the substrate D. However, by repeating the film formation and ashing, there is a possibility that the carbon film gradually accumulates on the electrodes 11 and the residue is generated as particles after ashing. When the coating step of forming the carbon film on the electrodes 11 in a state where the substrate D is not arranged in the film formation chamber 10 after the removing step of the carbon film through ashing so as to prevent the accumulation and the residue from peeling to generate particles is provided, the accumulation of the carbon film and the residue on the surfaces 11a of the electrodes 11 are coated with a uniform carbon film and the accumulation and the residue are less likely to be peeled from the electrodes 11, thus making it possible to prevent the generation of particles.

In a state where the carbon film accumulated on the surfaces 11a of the electrodes 11 is completely removed through ashing thereby exposing an electrode material constituting the electrodes 11, there is a possibility that the surfaces 11a are sputtered by ions formed in the film formation chamber 10 and the electrode material is released into the film formation chamber 10, and thus the electrode material may be mixed into the carbon protective film 24 formed on the surface of the substrate D. In the present embodiment, it is possible to prevent the electrode material from sputtering by providing the coating step of forming the carbon film on the electrodes 11 after the removing step of ashing the carbon film accumulated on the surfaces 11a of the electrodes 11.

It is considered that performing the above coating step by a method of forming the carbon film on the surfaces 11a of the electrodes 11 in a state where the substrate D is arranged in the film formation chamber 10 is possible. However, the method is not preferred by the following reason. Namely, when the carbon film is formed on the electrodes 11 in a state where the substrate D is arranged, radical species that form the carbon film are absorbed to the side of the substrate D and, as a result, a non-uniform carbon film is formed on the electrodes 11.

An example of the procedure upon formation of the carbon protective film 24 on the substrate will now be described.

First, a substrate D (see the reference symbol D shown in FIG. 2) in which a non-magnetic undercoat film 22 and a magnetic film 23 are laminated on a non-magnetic substrate 21 by a method such as a sputtering method was carried into a film formation chamber 10 of a film formation device 1 shown in FIG. 1 and a gas was circulated in the film formation chamber 10 by, while introducing a reacting gas supplied from a supply source 14 through an introducing tube 15, discharging the gas in the film formation chamber 10 to the outside through a discharging tube 16, thereby exposing the surfaces D1, D2 of the substrate D to the reacting gas.

As the reacting gas, a mixed gas obtained by mixing a hydrocarbon and hydrogen in a mixing volume ratio within a range from 1:0.5 to 1:100 is used.

It is preferred to use, as the hydrocarbon in the present embodiment, one or more kinds of a lower saturated hydrocarbon, a lower unsaturated hydrocarbon and a lower cyclic hydrocarbon.

As the lower saturated hydrocarbon, for example, methane, ethane, propane, butane and octane can be used. As the lower unsaturated hydrocarbon, for example, ethylene, propylene, butylene and butadiene can be used. As the lower cyclic hydrocarbon, for example, benzene, toluene, xylene, styrene, naphthalene, cyclohexane and cyclohexadiene can be used.

Of these hydrocarbons, toluene is preferably used. The mixing ratio of toluene to hydrogen is preferably adjusted within a range from 1:15 to 1:20 in terms of volume ratio.

As used herein, "lower" means that the number of carbon atoms is within a range from 1 to 10. "Cyclic hydrocarbon" means a hydrocarbon having a cyclic structure such as a benzene ring.

The reason why the mixing ratio of hydrocarbon to hydrogen was adjusted within the above range in the present embodiment is as follows. Namely, when the mixing ratio of hydrocarbon to hydrogen is less than the lower limit of the above range, the film formation rate decreases and it becomes unsuitable for practical industrial production. In contrast, when the mixing ratio of hydrocarbon to hydrogen is more than the upper limit of the above range, stress remaining in the carbon protective film formed on the surface of the substrate D increases, and adhesion and CSS resistance of the resulting carbon protective film deteriorate.

The reason why the lower hydrocarbon is preferably used as the hydrocarbon is as follows. Namely, when the number of carbon atoms of the hydrocarbon is more than the upper limit of the above range, it becomes difficult to supply as the gas and decomposition of the hydrocarbon upon discharging does not proceed smoothly, and also the carbon protective film contains a large amount of a polymer component having a low strength.

In order to perform a circulation operation of the reacting gas, the flow rate of the reacting gas is preferably adjusted within a range from 50 to 500 sccm. It is preferred to maintain the internal pressure of the film formation chamber 10 to a predetermined value, for example, within a range from 0.1 to 10 Pa by appropriately adjusting the discharge amount of the gas in the film formation chamber 10 using a discharge amount control valve 17.

Simultaneously with the circulation operation of the reacting gas, high frequency electric power, preferably within a range from 50 to 2,000 W, was supplied to the electrodes 11 using a high frequency power source 12 thereby generating plasma to form a carbon protective film 24 on both surfaces D1, D2 of the substrate D by plasma chemical vapor deposition using the reacting gas as a material. The thickness of the carbon protective film 24 is preferably adjusted within a range from 30 to 100 Å. The carbon protective film 24 can be simultaneously formed on both surfaces (D1, D2) of the substrate D by the method of the present embodiment.

When electric power is supplied to the electrodes 11, each phase of the electric power to be supplied to these electrodes 11 (two electrodes 11 in the example shown in FIG. 1) is preferably shifted for the following reason. Namely, the film formation rate and the durability of the carbon protective film can be improved by shifting each phase of the electric power to be supplied to both electrodes 11. Phase difference of the electric power to be supplied to both electrodes 11 is preferably adjusted within a range from 90 to 270°, and is more preferably adjusted to reverse phase (180°).

Upon formation of the carbon protective film 24, film formation is preferably performed while applying a high frequency bias or a pulse current bias to the substrate D using a bias power source 13. When a high frequency power source is used as the bias power source 13, high frequency electric power within a range from 10 to 300 W is preferably applied to the substrate D. When a pulse current power source is used as the bias power source 13, a voltage (average voltage) within a range from −400 to −10 V is preferably applied to the substrate D. In this case, the pulse width is preferably adjusted within a range from 10 to 50,000 n seconds, while the frequency is preferably adjusted within a range from 10 kHz to 1 GHz.

When the bias is applied to the substrate D, the bias may be directly added to the substrate D, or the bias may be applied through a substrate carrier (not shown).

To cope with practical industrial production, the film formation rate of the carbon protective film 24 is preferably adjusted to 200 Å (20 nm)/min or more, and more preferably 400 Å/min or more.

In the present embodiment, the film formation time in the film formation step of forming the carbon protective film 24 on the surface of the substrate D in the film formation chamber 10 is preferably adjusted within a range from 5 to 60 seconds when 600 W high frequency electric power is supplied to a disk-shaped substrate having a diameter of 3.5 inch. The ashing time in the removing step of removing the carbon film accumulated on the surfaces 11a of the electrodes 11 through ashing in a state where the substrate D is not arranged in the film formation chamber 10 is preferably adjusted within a range from 5 to 300 seconds in the case of oxygen plasma in which 600 W high frequency electric power is supplied. Furthermore, the film formation time in the coating step of forming the carbon film to the electrodes 11 in the case where the substrate D is not arranged in the film formation chamber 10 is preferably adjusted within a range from 5 seconds to 300 seconds when 600 W high frequency electric power is supplied.

In the present embodiment, when the film formation step of forming the carbon protective film 24 on the surfaces D1, D2 of the substrate D arranged in the film formation chamber 10 is performed multiple times, the number of times is preferably within a range from 2 to 100.

According to the method for forming a carbon protective film of the present invention, it is possible to prevent a carbon film deposited on the surfaces 11a of electrodes 11 from being released into a film formation chamber 10 in the form of particles generated after peeling because it is a method comprising using, as the electrodes, electrodes whose surfaces 11a have been subjected to a roughening treatment, a film formation step of forming a carbon protective film 24 on the substrate D in a state where the substrate D is arranged in the film formation chamber 10, and a removing step of removing a carbon film accumulated on the surfaces 11a of the electrodes 11 through ashing in a state where the substrate D is not arranged in the film formation chamber 10, and repeating the film formation step and the removing step in this sequence in the case of forming the carbon protective film 24 on both surfaces of the substrate D by a chemical vapor deposition (CVD) method.

In the method for forming a carbon protective film of the present embodiment, since the film formation step is performed in a state where the carbon film accumulated on the surfaces 11a of the electrodes 11 is not completely removed by performing the removing step after repeating the film formation step multiple times, it is possible to prevent an electrode material from being released into the film formation chamber 10 as particles generated by sputtering.

In the method for forming a carbon protective film of the present embodiment, since the coating step of forming the carbon film on the surfaces 11a of the electrodes 11 in a state where the substrate D is not arranged in the film formation chamber 10 between the removing step and the subsequent film formation step, sputtering of the surfaces 11a of the electrodes 11 can be prevented, and the accumulation and the residue on the electrodes 11 are less likely to be peeled from the surfaces 11a, thus making it possible to effectively suppress the generation of particles in the film formation chamber 10.

Therefore, mixing of particles into the carbon protective film can be prevented, thus making it possible to form a carbon protective film 24 having excellent flatness.

Method for Producing Magnetic Recording Medium

The method for producing a magnetic recording medium of the present embodiment is a method of forming at least a magnetic film 23 and a carbon protective film 24 on a non-magnetic substrate 21, as shown in FIG. 2, in which the carbon protective film 24 is formed using the above method for forming a carbon protective film of the present embodiment, or the above film formation device (CVD apparatus for formation of a carbon protective film) of the present embodiment.

In the method for producing a magnetic recording medium of the present embodiment, the non-magnetic undercoat film 22 and the magnetic film 23 are formed on both surfaces (only one surface is shown in FIG. 2) of the non-magnetic substrate 21 using a method such as a sputtering method.

The method for producing a magnetic recording medium of the present embodiment will now be described in detail.

In the present embodiment, first, the surface of the above non-magnetic substrate 21 is subjected to a texturing treatment and then the non-magnetic substrate 21 is subjected to a cleaning treatment. In this case, the non-magnetic substrate 21 may be subjected to a pretreatment using the above treating gas before subjecting to the texturing treatment. Also, the non-magnetic substrate 21 may be subjected to a pretreatment using the treating gas before and/or after the cleaning treatment of the non-magnetic substrate 21. Alternately, the non-magnetic substrate 21 may be subjected to a pretreatment using the treating gas before subjecting to the texturing treatment, and before the cleaning treatment and/or after the cleaning treatment.

The texturing treatment to be subjected to the non-magnetic substrate 21 is not essential, but is preferred because the magnetic film 23 is provided with magnetic anisotropy and adsorption of the magnetic head and the magnetic recording medium can be prevented and also magnetic anisotropy is improved by subjecting to the texturing treatment.

There are no restrictions on the method for the texturing treatment and, for example, the non-magnetic substrate 21 can be textured in a circumference direction by subjecting the surface to machining using a fixed abrasive and/or a loose abrasive. In this case, the texturing treatment can be performed by bringing the surface of the non-magnetic substrate 21 into contact with an abrasive tape for texturing through pressing, rotating the non-magnetic substrate 21 while supplying an abrasive slurry containing an abrasive between the non-magnetic substrate 21 and the tap, and transferring the tape.

The cleaning treatment of the non-magnetic substrate 21 can be mainly performed by immersion in an alkali cleaner or a neutral cleaner, scrub cleaning, shake-off drying with pure water or IPA vapor drying. There are no restrictions of the order of the immersion in the alkali cleaner or the neutral cleaner and scrub cleaning. In order to improve wettability of the non-magnetic substrate 21, the immersion of the alkali cleaner or the neutral cleaner is preferably performed first. Since wettability is improved by subjecting the non-magnetic substrate 21 to the pretreatment, this order is not essential.

Since wettability is improved by subjecting the non-magnetic substrate 21 to a pretreatment using the treating gas before the cleaning treatment, the generation of pits can be suppressed by the alkali cleaner or the neutral cleaner not being required or by drastically decreasing the concentration, and thus error caused by pits can be prevented.

The scrub cleaning is preferably performed using a cup brush or a roll brush.

Since the organic matter residue is decomposed into $H_2O$ and $CO_2$ and vaporized by subjecting the non-magnetic substrate 21 to a pretreatment using the treating gas after the cleaning treatment, the effect of removing the organic matter residue can be improved and error caused by the organic matter residue can be prevented, thus making it possible to improve floating characteristics of the head.

As the device for a pretreatment, a plasma generating unit capable of stably generating plasma under a pressure close to atmospheric pressure can be used. For example, a normal pressure plasma surface modifying unit (manufactured by Sekisui Chemical Co., Ltd.) and an atmospheric pressure plasma cleaning head (manufactured by Matsushita Electric Works, Ltd.) can be used. "A pressure close to atmospheric pressure" means a pressure of $1.3 \times 10^4$ to $13 \times 10^4$ Pa. It is particularly preferred to use a pressure of $9.9 \times 10^4$ to $10.3 \times 10^4$ Pa close to an atmospheric-pressure because it is easy to adjust the pressure and the constitution of the device becomes simple.

Next, a non-magnetic undercoat film 22, a magnetic film 23 and a carbon protective film 24 are sequentially formed on the non-magnetic substrate 21 subjected to the above treatment in the film formation step.

The method for formation of each layer of the magnetic recording medium may be any method and examples of the method for formation of the non-magnetic undercoat film 22 and the magnetic film 23 include physical vapor deposition methods such as a DC (magnetron) sputtering method, a high frequency (magnetron) sputtering method, an ECR sputtering method and a vacuum vapor deposition method.

Figure 3:
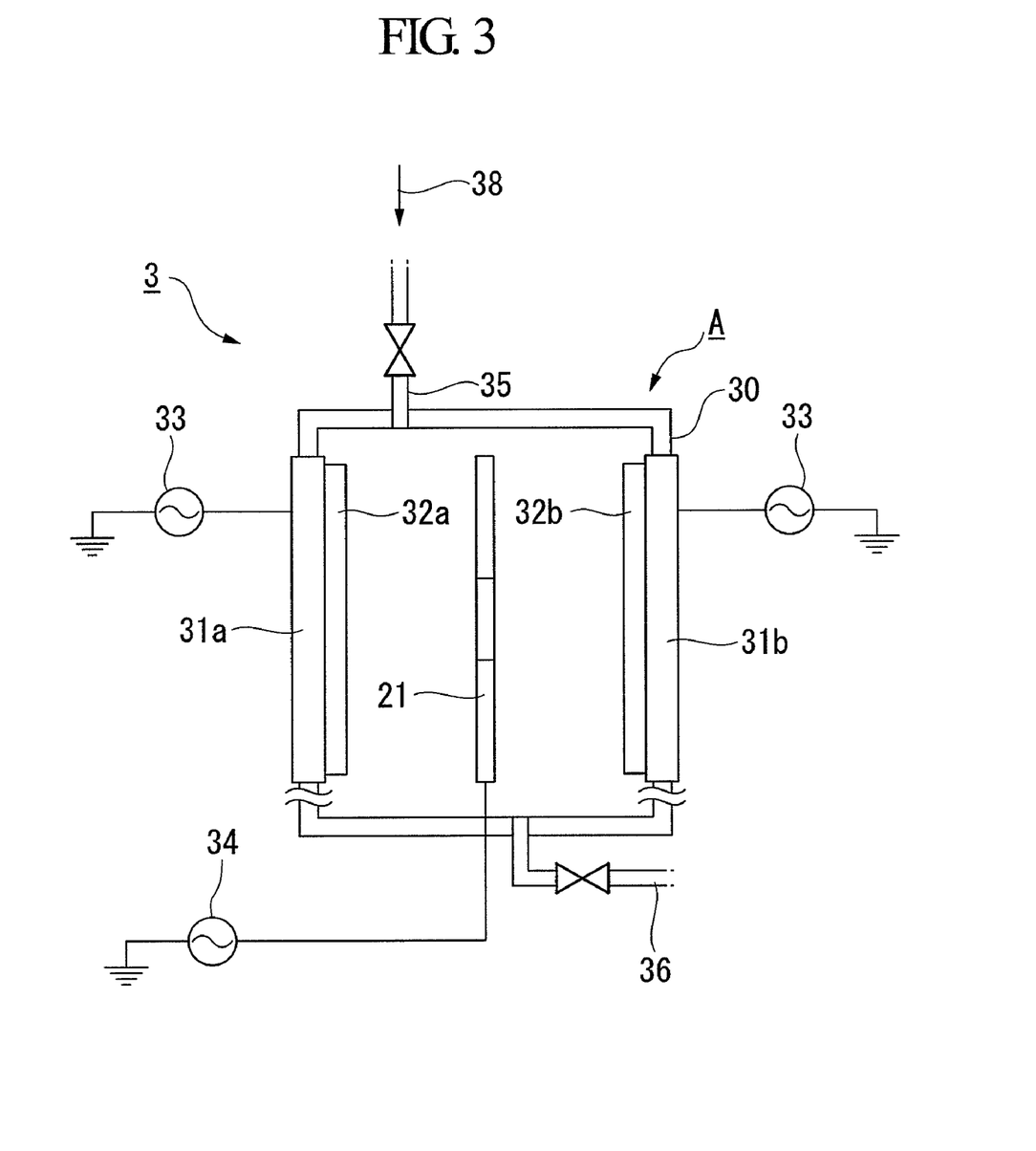
FIG. 3 is a view that schematically illustrates an example of a method for producing a magnetic recording medium of the present invention, in which a sputtering film formation device for formation of a non-magnetic undercoat film and a magnetic film on the surface of a non-magnetic substrate is shown.

In the manufacturing method of the present embodiment, the film formation device used in the film formation step of each non-magnetic undercoat film 22 and the magnetic film 23 may be a sputtering film formation device 3 using a sputtering method, as shown in FIG. 3, in which a non-magnetic substrate 21 in an upright state is freely encased in a chamber 30 and target materials 32a, 32b are arranged at both surface sides of the non-magnetic substrate 21, and also magnet plates 31a, 31b are arranged in parallel at the side opposite the substrate of the target materials 32a, 32b and a high frequency power source 33 is freely connected so as to apply high frequency voltage to the target materials 32a, 32b.

With the composition of the sputtering film formation device 3 shown in FIG. 3, a bias power source 34 for applying a high frequency voltage is connected to the non-magnetic substrate 21 and a DC voltage can be applied to the target materials 32a, 32b, in addition to high frequency voltage. This bias power source 34 may be omitted.

To the chamber 30 of the film formation device 30, an introducing tube 35 with a valve for introducing a sputtering gas 38 is connected and also a discharging tube 36 with a valve for connecting the interior of the chamber 30 to a vacuum pump is connected, and thus the interior of chamber 30 can be evacuated.

In the sputtering film formation device 3 as the example shown in the drawing, the interior of chamber 30 is evacuated to a predetermined pressure and the sputtering gas 38 is introduced through the introducing tube 35 with a valve, thereby generating plasma around the target materials 32a, 32b, and then a thin film is formed on the surface of the non-magnetic substrate 21 encased in the chamber 30 by a sputtering method and the non-magnetic undercoat film 22 and the magnetic film 23 are formed.

On the magnetic film 23, the carbon protective film 24 is formed by the above formation method or film formation device of the present embodiment using a plasma CVD method.

On the carbon protective film 24 which the film was formed by the formation method of the present embodiment, a lubricant layer 25 is preferably formed.

The lubricant used in the lubricant layer 25 includes the materials described above, and a lubricant layer 25 having a thickness of 1 to 4 nm is commonly formed using the above materials. As the method for formation of the lubricant layer 25, for example, conventionally known methods such as a dipping method and a spin-coating method can be employed.

According to the method for producing the magnetic recording medium 2 of the present embodiment, in the case of manufacturing a magnetic recording medium 2 by forming at least a magnetic film 23 and a carbon protective film 24 on a non-magnetic substrate 21, since the carbon protective film 24 is formed using the above method for forming a carbon protective film or the above film formation device (CVD apparatus for formation of a carbon protective film), a carbon protective film 24 having excellent flatness can be formed and a magnetic recording medium 2 that has high recording density and excellent recording/reproducing characteristics can be obtained.

Magnetic Recording/Reproducing Apparatus

Figure 4:
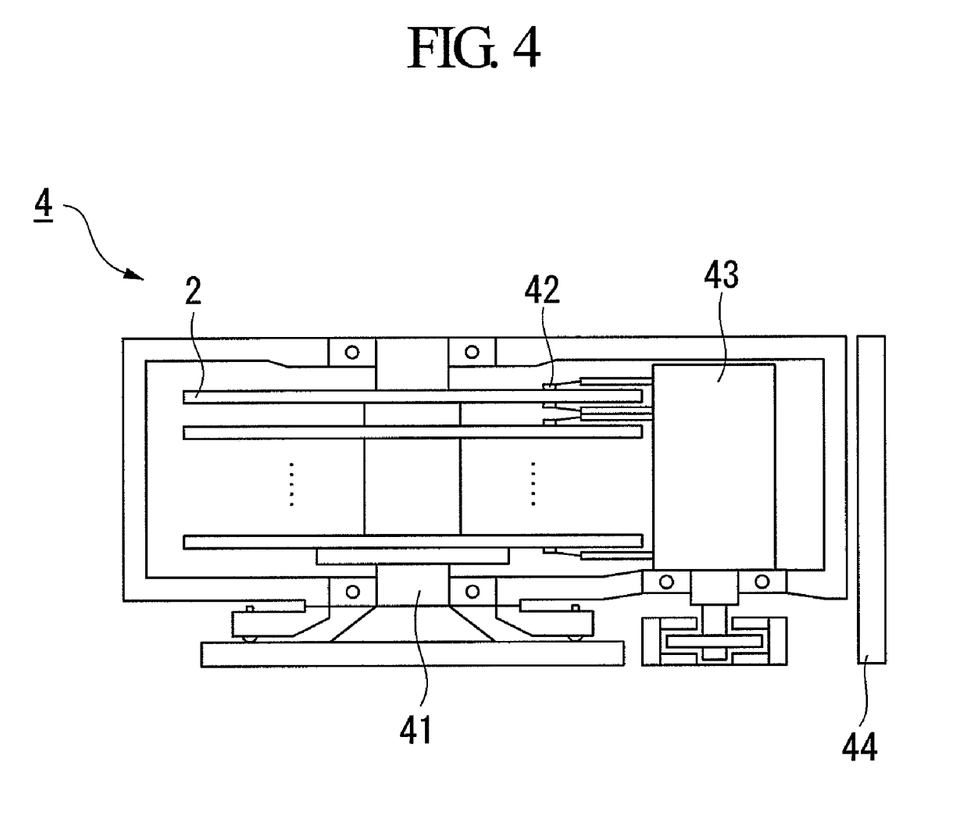
FIG. 4 is a view that schematically illustrates an example of a magnetic recording/reproducing apparatus of the present invention.

FIG. 4 illustrates an example of a magnetic recording/reproducing apparatus using a magnetic recording medium obtained by the above method for forming a carbon protective film and the above method for producing a magnetic recording medium of the present invention.

This magnetic recording/reproducing apparatus 40 includes a magnetic recording medium 2 obtained by the above formation method and the above production method, a medium driving section 41 operable to rotationally drive the magnetic recording medium 2, a magnetic head 42 for recording/reproducing information to the magnetic recording medium 2, a head driving section (head driving means) 43 and a recording/reproducing signal processing system (recording/reproducing signal processing means) 44. The recording/reproducing signal processing system 44 is capable of processing input data and sending recorded signals to the magnetic head 42, and is also capable of processing reproduced signals from the magnetic head 42 and outputting data.

The magnetic recording/reproducing apparatus of the present invention is excellent in recording/reproducing characteristics because a magnetic recording medium obtained by the method for forming a carbon protective film and the method for producing a magnetic recording medium described above is used.

EXAMPLES

Examples for illustrating a method for forming a carbon protective film and a method for producing a magnetic recording medium of the present invention will now be described, but the present invention is not limited only to these Examples.

Example 1

A non-magnetic substrate 21 which was composed of a NiP-plated aluminum substrate and which was subjected to a texturing treatment using an alumina slurry so as to have a surface roughness Ra of 20 Å was set in a chamber 30 of a sputtering film formation device 3 (a DC magnetron sputtering device) like that shown in FIG. 3. After evacuating the chamber 30 to an ultimate vacuum of $2\times10^{-4}$ Pa, a 400 Å thick non-magnetic undercoat film 22 made of Cr and a magnetic film 23 made of a Co82Cr15Ta3 (atomic %) alloy were sequentially formed on both surfaces of the non-magnetic substrate 21 to obtain a substrate D.

Next, the substrate D was carried into a film formation chamber 10 of a film formation device 1 (plasma CVD apparatus) like that shown in FIG. 1. The electrodes 11 of the film formation device 1 are made of $SUS_3O_4$ and the surface roughness Ra was adjusted to 8.5 μm by subjecting the surface 11a to a sandblasting treatment using SiC particles #20-#30.

Next, a reacting gas prepared by mixing a methane gas with a hydrogen gas in a volume mixing ratio of 1:100 was supplied into the film formation chamber 10. In this case, the internal pressure of the film formation chamber 10 was adjusted to 2 Pa.

Simultaneously with the circulation of the above reacting gas in the film formation chamber 10, a 300 W high frequency electric power (frequency: 13.56 MHz) was supplied to the electrodes 11 while applying high frequency bias (50 W) to a substrate D, thereby generating plasma in the film formation chamber 10 to form a carbon protective film 24 having a thickness of 50 Å on both surfaces D1, D2 of the substrate D. Upon film formation, the temperature of the substrate D was adjusted to 130° C. Also, the distance between the substrate D and the electrodes 11 was adjusted to 30 mm, the phase difference of the electric power to be supplied to two electrodes 11, 11 was adjusted to 180° and the film formation time was adjusted to 8 seconds.

Next, the substrate was removed from the film formation chamber 10 and oxygen gas plasma was generated in the film formation chamber 10 thereby subjecting the surfaces 11a of the electrodes 11 to an ashing treatment. In this case, the pressure of an oxygen gas in the film formation chamber 10 was adjusted to 5 Pa, high frequency electric power to be supplied to the electrodes 11 was adjusted to 600 W, and the ashing time was adjusted to 8 seconds.

The above film formation step of forming the carbon protective film 24 on the substrate D and the above removing step through the ashing treatment in the film formation chamber 10 were repeated 1,000 times to manufacture 1,000 magnetic recording media 2.

Example 2

A non-magnetic substrate 21 which was composed of a NiP-plate-d aluminum substrate and which was subjected to a texturing treatment using an alumina slurry so as to have a surface roughness Ra of 20 Å was set in a chamber 30 of a sputtering film formation device 3 (a DC magnetron sputtering device) like that shown in FIG. 3. After evacuating the chamber 30 to an ultimate vacuum of $2\times10^{-4}$ Pa, a 400 Å thick non-magnetic undercoat film 22 made of Cr and a magnetic film 23 made of a Co82Cr15Ta3 (atomic %) alloy were sequentially formed on both surfaces of the non-magnetic substrate 21 to obtain a substrate D.

Next, the substrate D was carried into a film formation chamber 10 of a film formation device 1 (plasma CVD apparatus) like that shown in FIG. 1. The electrodes 11 of the film formation device 1 are made of SUS304 and the surface roughness Ra was adjusted to 8.5 μum by subjecting the surface 11a to a sandblasting treatment using SiC particles #20-#30.

Next, a reacting gas prepared by mixing a methane gas with a hydrogen gas at a volume mixing ratio of 1:100 was supplied into the film formation chamber 10. In this case, the internal pressure of the film formation chamber 10 was adjusted to 2 Pa.

Simultaneously with the circulation of the above reacting gas in the film formation chamber 10, 300 W high frequency electric power (frequency: 13.56 MHz) was supplied to the electrodes 11 while applying high frequency bias (50 W) to a substrate D, thereby generating plasma in the film formation chamber 10 to form a carbon protective film 24 having a thickness of 50 Å on both surfaces D1, D2 of the substrate D. Upon film formation, the temperature of the substrate D was adjusted to 130° C. Also, the distance between the substrate D and the electrodes 11 was adjusted to 30 mm, the phase difference of the electric power to be supplied to two electrodes 11, 11 was adjusted to 180° and the film formation time was adjusted to 8 seconds. Under these conditions, the carbon protective film 24 was continuously formed in the film formation chamber 10 with respect to 25 substrates D.

Next, the substrate was removed from the film formation chamber 10 and oxygen gas plasma was generated in the film formation chamber 10 thereby subjecting the surfaces 11a of the electrodes 11 to an ashing treatment. In this case, the pressure of an oxygen gas in the film formation chamber 10 was adjusted to 5 Pa, high frequency electric power to be supplied to the electrodes 11 was adjusted to 600 W, and the ashing time was adjusted to 60 seconds.

Next, a coating step of forming a carbon film on the surfaces 11a of the electrodes 11 was performed in a state where the substrate D is not arranged in the film formation chamber 10. In this case, the film formation (coating) conditions were as follows. A reacting gas prepared by mixing methane gas with hydrogen gas in a mixing volume ratio of 1:100 was supplied in the chamber and the internal pressure of the film formation chamber 10 was adjusted to 2 Pa. Also, the electric power to be supplied to the electrodes 11 was adjusted to 300 W high frequency (frequency: 13.56 MHz) and the phase difference of the electric power to be supplied to two electrodes 11, 11 was adjusted to 180°. In this case, the film formation time was adjusted to 30 seconds.

In addition to repetition of the same film formation and removing steps as those in Example 1, an operation of a coating step was repeated 40 times to manufacture 1,000 magnetic recording media 2.

Comparative Example 1

Using the same procedure as in Example 1, except that the removing step through the ashing treatment was not provided, the operation of the film formation step of the carbon protective film was continuously performed to manufacture 1,000 magnetic recording media (Comparative Example 1) under these conditions.

Comparative Example 2

Using the same procedure as in Example 1, except that the surfaces of the electrodes arranged in the film formation chamber for formation of the carbon protective film was not subjected to a sandblasting treatment, the operation of the film formation step of the carbon protective film was continuously performed to manufacture 1,000 magnetic recording media (Comparative Example 2) under these conditions. The surface roughness (Ra) of the surfaces of the electrodes in the film formation chamber was adjusted to 2 μm.

Evaluation Procedure

With respect to the respective 1,000 magnetic recording media manufactured under the respective conditions of Examples 1 and 2, and Comparative Examples 1 and 2, the measurement of the number of dusts adhered on the surface of the magnetic recording medium and the analysis of the carbon protective film using secondary ionization mass spectrometer (SIMS) were performed and then the results were evaluated.

The number of dusts was measured by the following procedure. Namely, the surface of the magnetic recording medium was irradiated with halogen lamp light and the number of bright spots of dust that can be visually observed by irradiation was counted.

With respect to the analysis using SIMS, the count number of Fe atoms in the carbon protective film was compared.

The evaluation results of the above Examples and Comparative Examples are shown in Table 1 below.

TABLE 1

| No. | Number of dusts | Count number of Fe atoms in SIMS analysis |
|---|---|---|
| Example 1 | 0 | 250 |
| Example 2 | 0 | 0 |
| Comparative Example 1 | 12 | 4,000 |
| Comparative Example 2 | 5 | 3,000 |

Evaluation Results

As shown in Table 1, in the magnetic recording media of Examples 1 and 2 obtained by the method for forming a carbon protective film and the method for producing a magnetic recording medium of the present invention, dusts scarcely adhered on the surface of the magnetic recording media and dust could not be visually observed. It became apparent that the magnetic recording media of Examples 1 and 2 contain a very small amount of Fe atoms in the carbon protective film.

In contrast, with respect to the magnetic recording medium of Comparative Example 1 manufactured by a conventional manufacturing method in which the carbon protective film was formed by a conventional manufacturing method, the number of dusts adhered on the surface of the magnetic recording medium remarkably increased to 12 as compared with the magnetic recording media of Examples 1 and 2 and the number of Fe atoms in the carbon protective film remarkably increased to 4,000 (count number). The reason is considered as follows. Namely, in the magnetic recording medium of Comparative Example 1, since the removing step in a state where the substrate is not arranged in the film formation chamber and the coating step of forming the carbon film on the electrode were not performed, the carbon film peeled from the surfaces of the electrodes adheres on the surface of the carbon protective film on the substrate in the form of particles and the surfaces of the electrodes is sputtered, and thus an electrode material is released into the film formation chamber and mixed into the carbon protective film.

In the magnetic recording medium of Comparative Example 2 in which the surfaces of the electrodes arranged in the film formation chamber was not subjected to a sandblasting treatment (a roughening treatment), the number of dusts adhered on the surface of the magnetic recording medium increased to 5 as compared with the magnetic recording media of Examples 1 and 2 and the number of Fe atoms in the carbon protective film remarkably increased to 3,000 (count number). The reason is considered as follows. Namely, in the magnetic recording medium of Comparative Example 2, since the surfaces of the electrodes arranged in the film formation chamber were not subjected to a roughening treatment, the carbon film accumulated on the surfaces of the electrodes peels easily and adheres on the surface of the carbon protective film on the substrate in the form of particles and also the surfaces of the electrodes are sputtered, and thus an electrode material is released into the film formation chamber and mixed into the carbon protective film.

As described above, according to the method for forming a carbon protective film of the present invention, it is possible to effectively decrease the generation of particles in a film formation chamber and to form a carbon protective film having excellent flatness. Therefore, it is apparent that a magnetic recording medium obtained by the method for producing a magnetic recording medium of the present invention has high recording density and also has excellent recording characteristics.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

The invention claimed is:

1. A method for forming a carbon protective film in which a disk-shaped substrate with a magnetic film formed thereon is arranged and electrodes are arranged in spaced opposed relation to each other on both surfaces of the substrate in a film formation chamber, and then plasma is generated between the electrodes and the substrate in a carbon-containing gas thereby forming a carbon protective film on both surfaces of the substrate through a chemical vapor deposition (CVD) method, the method comprising:

using, as the electrodes, electrodes whose surfaces have been subjected to a roughening treatment, a film formation step of forming a carbon protective film on the substrate in a state where the substrate is arranged in the film formation chamber, and a removing step of removing a carbon film accumulated on the surfaces of the electrodes through ashing in a state where the substrate is not arranged in the film formation chamber, and repeating the film formation step and the removing step in this sequence.

2. The method for forming a carbon protective film according to claim 1, wherein the film formation step and the removing step are repeated in this sequence, and the removing step is performed after repeating the film formation step multiple times.

3. The method for forming a carbon protective film according to claim 1, wherein the film formation step and the removing step are repeated in this sequence, and a coating step of forming a carbon film on the surfaces of the electrodes in a state where the substrate is not arranged in the film formation chamber is further provided between the removing step and the subsequent film formation step.

4. The method for forming a carbon protective film according to claim 2, wherein the film formation step and the removing step are repeated in this sequence, and a coating step of forming a carbon film on the surfaces of the electrodes in a state where the substrate is not arranged in the film formation chamber is further provided between the removing step and the subsequent film formation step.

* * * * *